US010289164B2

(12) United States Patent
Seo et al.

(10) Patent No.: US 10,289,164 B2
(45) Date of Patent: May 14, 2019

(54) ROLLABLE DISPLAY DEVICE

(71) Applicant: SAMSUNG DISPLAY CO., LTD., Yongin-si, Gyeonggi-do (KR)

(72) Inventors: Tae An Seo, Hwaseong-si (KR); Min-Sung Kim, Hwaseong-si (KR); Bo Ik Park, Uiwang-si (KR); Jung Hun Lee, Hwaseong-si (KR); Jin Hwan Choi, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 48 days.

(21) Appl. No.: 15/604,096

(22) Filed: May 24, 2017

(65) Prior Publication Data

US 2017/0359910 A1 Dec. 14, 2017

(30) Foreign Application Priority Data

Jun. 9, 2016 (KR) .................. 10-2016-0071802

(51) Int. Cl.
*F16M 11/38* (2006.01)
*G06F 1/16* (2006.01)
*A47B 97/00* (2006.01)
*E05D 1/00* (2006.01)
*E05D 3/06* (2006.01)
(Continued)

(52) U.S. Cl.
CPC ............ *G06F 1/1652* (2013.01); *A47B 97/00* (2013.01); *E05D 1/00* (2013.01); *E05D 3/06* (2013.01); *F16M 11/38* (2013.01); *G06F 1/1601* (2013.01); *G06F 1/166* (2013.01); *G06F 1/1641* (2013.01); *H04N 5/64* (2013.01); *H05K 1/028* (2013.01); *H05K 5/0017* (2013.01); *H05K 5/0217* (2013.01); *A47B 2097/006* (2013.01); *E05Y 2900/606* (2013.01);
(Continued)

(58) Field of Classification Search
CPC ...................................... G03B 21/58
See application file for complete search history.

(56) References Cited

U.S. PATENT DOCUMENTS 7,595,930 B2 * 9/2009 Adams .................. G03B 21/58
359/443
7,821,709 B2 * 10/2010 Anderson ............. G03B 21/60
353/79
(Continued)

FOREIGN PATENT DOCUMENTS

KR 10-2010-0114148 A 10/2010
KR 10-1049240 B1 7/2011
(Continued)

*Primary Examiner* — Christopher E Mahoney
(74) *Attorney, Agent, or Firm* — Lewis Roca Rothgerber Christie LLP

(57) ABSTRACT

A rollable display device includes: a panel support including a plurality of support bars arranged in a direction and a plurality of flexible coupling portions between support bars of the plurality of support bars and coupling the plurality of support bars together; and a flexible display panel fixed to respective front sides of support bars of the plurality of support bars, and the plurality of support bars includes a first support bar that is spaced apart from an outermost support bar of the plurality of support bars, and the first support bar includes a pair of first holding bars that are spreadable toward an outside from a rear side of the first support bar.

15 Claims, 12 Drawing Sheets

(51) Int. Cl.
- *H05K 1/02* (2006.01)
- *H05K 5/00* (2006.01)
- *H05K 5/02* (2006.01)
- *H04N 5/64* (2006.01)
- *G06F 3/041* (2006.01)
- *G09F 9/30* (2006.01)

(52) U.S. Cl.
CPC .... *G06F 3/041* (2013.01); *G06F 2203/04102* (2013.01); *G09F 9/301* (2013.01)

(56) References Cited

U.S. PATENT DOCUMENTS

| | | | |
|---|---|---|---|
| 2006/0007368 A1 | 1/2006 | Slikkerveer et al. | |
| 2006/0080918 A1* | 4/2006 | Clubbe | F16M 11/16 52/238.1 |
| 2009/0065665 A1* | 3/2009 | Yoshino | F16M 11/38 248/171 |
| 2013/0307816 A1* | 11/2013 | Lee | G06F 1/1652 345/174 |
| 2014/0196254 A1* | 7/2014 | Song | E05D 3/14 16/302 |
| 2016/0187929 A1 | 6/2016 | Kim et al. | |

FOREIGN PATENT DOCUMENTS

| | | |
|---|---|---|
| KR | 10-2014-0121649 A | 10/2014 |
| KR | 101480066 B1 * | 1/2015 |
| KR | 10-1570869 B1 | 11/2015 |

* cited by examiner

ROLLABLE DISPLAY DEVICE

CROSS-REFERENCE TO RELATED APPLICATION

This application claims priority to and the benefit of Korean Patent Application No. 10-2016-0071802, filed on Jun. 9, 2016 in the Korean Intellectual Property Office, the entire content of which is incorporated herein by reference.

BACKGROUND

1. Field

Aspects of one or more embodiments of the present disclosure relate to a rollable display device.

2. Description of the Related Art

Related to a display device, interest in larger and clearer display devices and interest in display devices that can be easy to carry and store have increased. A flexible display device is a display where a plurality of pixels are arranged on a flexible substrate, such as a plastic film rather than a glass substrate, and has a property of ease of bending.

The flexible display can be variously realized, such as a rollable display device, a foldable display device, a stretchable display device, and the like. The rollable display device can be used by spreading a screen when necessary, and the screen may be rolled to reduce the size for carrying and storing.

The above information disclosed in this Background section is only for enhancement of understanding of the background of the described technology and therefore it may contain information that does not form the prior art that is already known in this country to a person of ordinary skill in the art.

SUMMARY

According to an aspect of one or more embodiments, a rollable display device can maintain a stable posture without falling back or moving when being used by spreading a screen of the rollable display device.

A rollable display device according to one or more exemplary embodiments includes: a panel support including a plurality of support bars arranged in a direction and a plurality of flexible coupling portions between support bars of the plurality of support bars and coupling the plurality of support bars together; and a flexible display panel fixed to respective front sides of support bars of the plurality of support bars, and the plurality of support bars includes a first support bar that is spaced apart from an outermost support bar of the plurality of support bars, and the first support bar includes a pair of first holding bars that are spreadable toward an outside from a rear side of the first support bar.

Respective first ends of each of the pair of first holding bars may be coupled to lateral ends of the rear side of the first support bar by first connection portions that are rotatable or bendable. Respective second ends of each of the pair of first holding bars opposite the respective first ends may be inclined to be parallel with a bottom plane when the first holding bars are unfolded, and each of the pair of first holding bars may include a first anti-slip coating layer at the second end.

The first support bar may include first recess portions in a rear side of the first support bar, and each of the pair of first holding bars may be receivable in the first recess portions while being in a folded state The panel support may be configured to include a first flat portion to contact a bottom plane, a curved portion that is connected with the first flat portion, and a second flat portion that is connected with the curved portion to remain in a floating state or a supported state above the bottom plane, and each of the pair of first holding bars may be contactable with the bottom plane while being unfolded. The first support bar may be a nearest support bar to the curved portion among support bars of the plurality of support bars that are included in the second flat portion.

The plurality of support bars may further include a pair of second support bars that are located at an outermost periphery of the panel support and do not overlap the flexible display panel. Each of the pair of second support bars may include a second holding bar that is spreadable to the outside from a front side of the second support bar.

Each of the pair of second holding bars may include a first portion and a second portion that are coupled to each other by a rotatable or bendable second connection portion, and an end of the second portion opposite the second connection portion may be slideable along a length direction of the second support bar such that an angle between the first portion and the second portion is changed.

Each of the pair of second holding bars may be configured to be in an unfolded state such that the first portion is parallel with a bottom plane, and each of the pair of second holding bars may include a second anti-slip coating layer on the first portion. Each of the pair of second support bars may include second recess portions in a front side of the second support bar, and the second holding bars may be receivable in the second recess portions while being folded.

Each of the pair of second support bars may include a third holding bar that is spreadable to the outside from a rear side of the second support bar. The third holding bar may include a third portion and a fourth portion that are coupled to each other by a rotatable or bendable fourth connection portion, and an end of the fourth portion opposite the fourth connection portion may be slideable along a length direction of the second support bar such that an angle between the third portion and the fourth portion is changed.

The third portion may be configured to be parallel with a bottom plane when the third holding bar is in an unfolded state, and the third portion may include a third anti-slip coating layer. Each of the second support bars may include third recess portions in a rear side of the second support bar, and the third holding bars may be receivable in the third recess portions while being folded.

The panel support may be configured to include a flat portion or a curved portion and to stand to be perpendicular to a bottom plane.

According to one or more exemplary embodiments, the rollable display device can maintain a stable posture without falling back or moving in a laptop mode or in a monitor mode, thereby increasing convenience of use.

DETAILED DESCRIPTION

Figure 1:
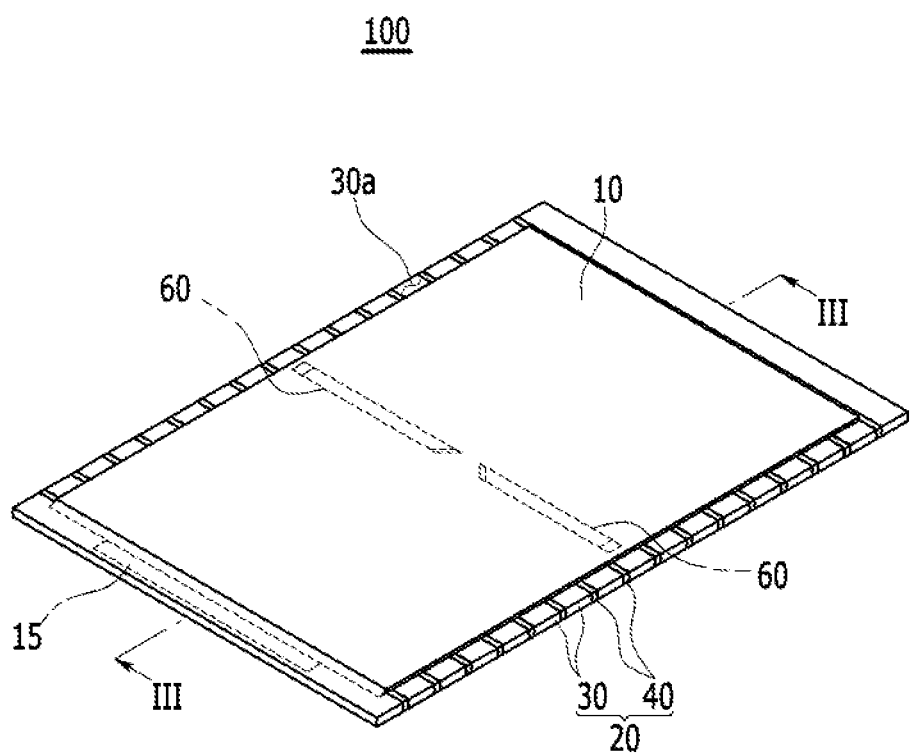
FIG. 1 is a perspective view of a rollable display device according to an exemplary embodiment, shown in an unfolded or unrolled state.

Herein, the present disclosure will be described more fully with reference to the accompanying drawings, in which some exemplary embodiments of the disclosure are shown. As those skilled in the art would realize, the described embodiments may be modified in various different ways, all without departing from the spirit or scope of the present disclosure.

The drawings and description are to be regarded as illustrative in nature and not restrictive. Like reference numerals designate like elements throughout the specification.

In addition, the size and thickness of each configuration shown in the drawings may be arbitrarily shown for better understanding and ease of description, but the present disclosure is not limited thereto. In the drawings, the thicknesses of layers, regions, etc., may be exaggerated for better understanding, ease of description, and clarity.

It is to be understood that when an element, such as a layer, film, region, or substrate, is referred to as being "on" another element, it can be directly on the other element or intervening elements may also be present. In contrast, when an element is referred to as being "directly on" another element, there are no intervening elements present.

In addition, unless explicitly described to the contrary, the word "comprise" and variations, such as "comprises" or "comprising," will be understood to imply the inclusion of stated elements but not the exclusion of any other elements.

In this specification, the phrase "on a plane" means viewing a target portion from the top, and the phrase "on a cross-section" means viewing a cross-section formed by vertically cutting a target portion from the side.

Figure 2:
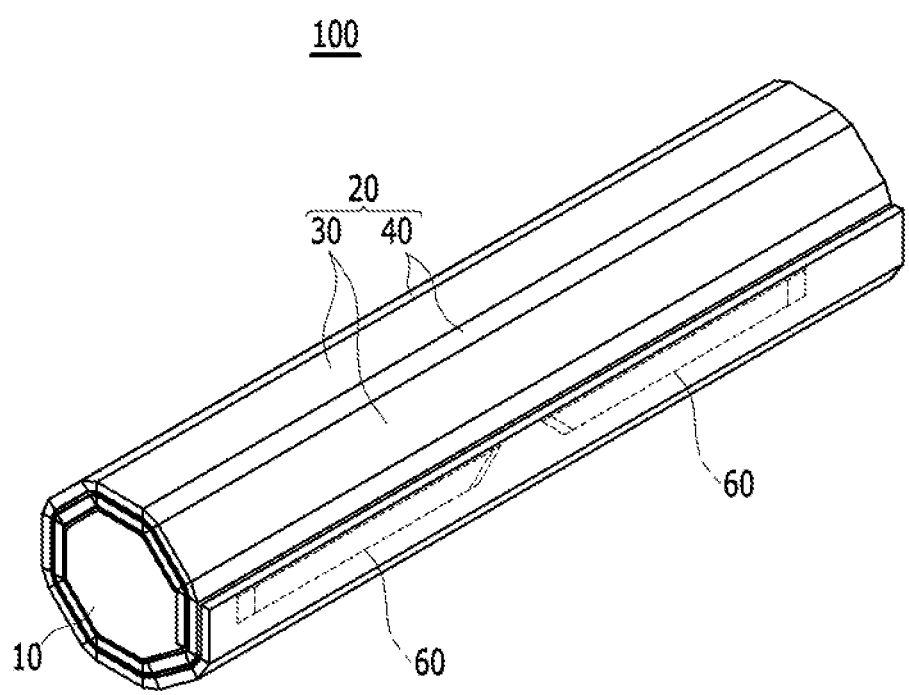
FIG. 2 is a perspective view of the rollable display device of FIG. 1, shown in a wound or rolled state.
Figure 3:
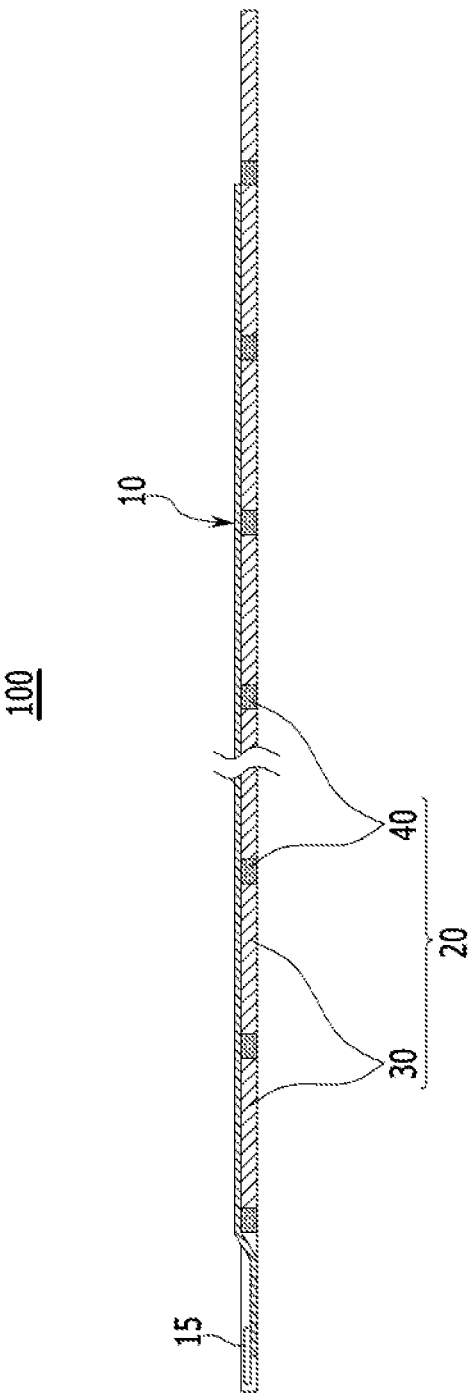
FIG. 3 is a cross-sectional view of the rollable display device of FIG. 1, taken along the line III-III.

FIG. 1 is a perspective view of a rollable display device according to an exemplary embodiment, shown in an unfolded or unrolled state; and FIG. 2 is a perspective view of the rollable display device of FIG. 1, shown in a wound or rolled state. FIG. 3 is a cross-sectional view of the rollable display device of FIG. 1, taken along the line III-III.

Referring to FIG. 1 to FIG. 3, a rollable display device 100 according to an exemplary embodiment includes a flexible display panel 10 and a panel support 20 that fixes and supports the flexible display panel 10.

The flexible display panel 10 is a display panel in which a plurality of pixels are arranged on a flexible substrate, such as a plastic film, and can be easily bent. The flexible display panel 10 may be any of an organic light emitting display panel, a liquid crystal display panel, or an electrophoretic display panel, but is not limited thereto.

In an embodiment, the flexible display panel 10 is an input device, and may include a touch sensor (not shown) through which a user inputs information by contacting a screen using a finger or a pen, for example.

The panel support 20 includes a plurality of support bars 30 that are arranged in parallel with each other along a direction, and a plurality of flexible coupling portions 40 that are provided between the support bars 30 to couple the support bars 30 to each other. In an embodiment, the flexible display panel 10 is fixed to a front side 30a of each of the plurality of support bars 30.

In an embodiment, each of the plurality of support bars 30 is a rectangular-shaped plate, and is made of a material that is harder than the flexible display panel 10. Each of the plurality of flexible coupling portions 40 has a structure assembly that can be bent and unfolded, and, for example, may have a multi-joint chain structure.

Figure 4:
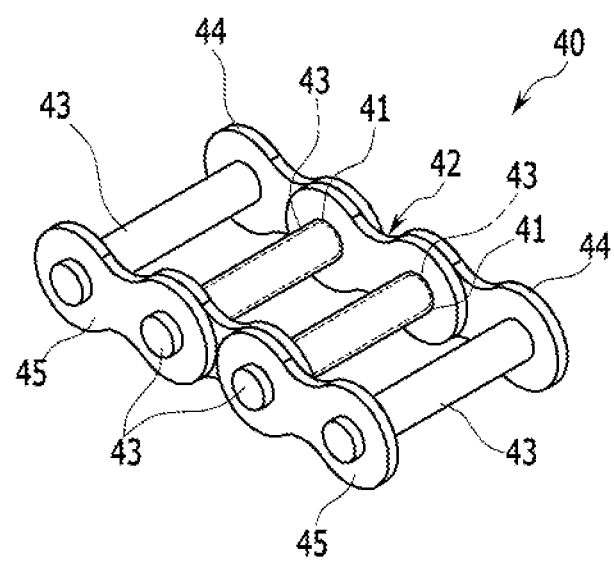
FIG. 4 is a perspective view of a flexible coupling portion of the rollable display device of FIG. 1.

FIG. 4 is a perspective view of a flexible coupling portion of the rollable display device 100, according to an exemplary embodiment.

Referring to FIG. 4, in an embodiment, the flexible coupling portion 40 may include at least one roller link 42 where two cylindrical rollers 41 are installed, at least two first plates 44 each having two connection pins 43, and at least two second plates 45 coupled to ends of the two connection pins 43.

One of the two connection pins 43, fixed to one of the first plates 44, may penetrate one cylindrical roller 41 and the other connection pin 43 may be fixed to one of the support bars 30. One of the two connection pins 43 fixed to the other first plate 44 may penetrate through the cylindrical roller 41 and the other may be fixed to another one of the support bars 30.

As an angle formed by the first plate 44 and the second plate 45 with respect to the roller link 42 is changed by an external force, the flexible coupling portion 40 can be bent or unfolded. The flexible coupling portion 40 may be provided singularly or in plural between two neighboring support bars 30, and, in an embodiment, the flexible coupling portion 40 can maintain a shape unless an external force (e.g., a predetermined external force) is applied thereto. The flexible coupling portion 40 is not limited to the example shown in FIG. 4.

Referring to FIG. 1 to FIG. 3, a relative angle of the two neighboring support bars 30 can be variously changed by the flexible coupling portion 40. In an embodiment, when the flexible coupling portion 40 is in an unfolded state, the two neighboring support bars 30 are disposed in parallel with each other, and when the flexible coupling portion 40 is in a bent state, the two neighboring support bars have an angle (e.g., a predetermined angle) with respect to each other.

In an embodiment, a bending direction of the flexible coupling portion 40 may be a concave deformation direction of the flexible display panel 10, that is, a direction in which the front sides 30a of the plurality of support bars 30 are rolled inside. In an embodiment, the flexible coupling portion 40 may be temporarily fixed such as to not be further bent after being completely unfolded, and when the flexible display panel 10 is to be rolled inside thereafter, the fixation may be released such that the flexible coupling portion 40 may be bent in a direction.

The rollable display device 100 may be unfolded to be flat as shown in FIG. 1, or may be rolled as shown in FIG. 2. FIG. 1 may show the rollable display device 100 in a display mode, and FIG. 2 may show the rollable display device 100 in a non-use mode so as to be moved or stored.

In an embodiment, a printed circuit body 15 may be fixed to one end of the flexible display panel 10. The flexible display panel 10 may receive an electrical signal from the printed circuit board 15 to perform displaying. The printed circuit board 15 and the one end of the flexible display panel 10 may be disposed in at least one support bar 30 that is located outermost among the plurality of support bars 30.

Figure 5:
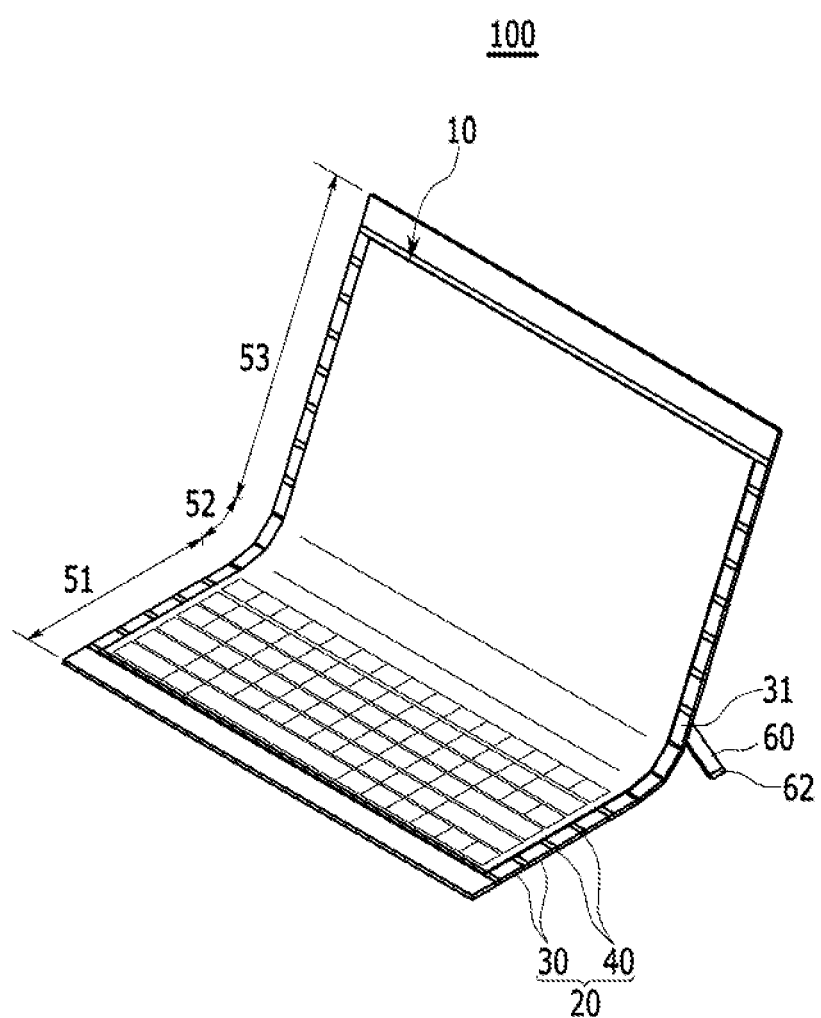
FIG. 5 is a perspective view of the rollable display device of FIG. 1, shown in a laptop mode.
Figure 6:
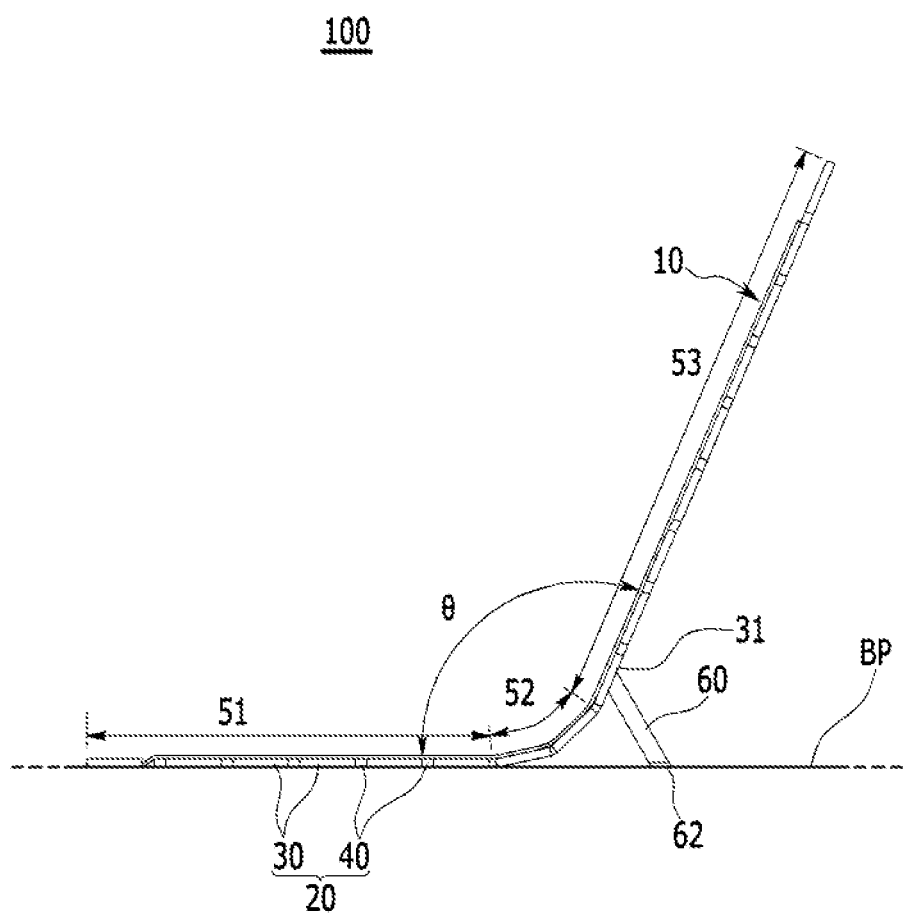
FIG. 6 is a side view of the rollable display device of FIG. 1, shown in a laptop mode.

FIG. 5 and FIG. 6 are a perspective view and a side view illustrating a laptop mode of the rollable display device 100.

Referring to FIG. 5 and FIG. 6, the rollable display device 100 according to an exemplary embodiment is physically configured to include a first flat portion 51, a curved portion 52, and a second flat portion 53. The curved portion 52 is disposed between the first flat portion 51 and the second flat portion 53, and the first flat portion 51, the curved portion 52, and the second flat portion 53 are sequentially located along a direction of the rollable display device 100.

The first flat portion 51 may be disposed in parallel with a bottom plane BP where the rollable display device 100 is placed, and the second flat portion 53 may be angled from the bottom plane BP, forming an angle (e.g., a right angle or greater) with the first flat portion 51. The curved portion 52 may also be distanced from the bottom plane BP. In FIG. 6, an angle between the first flat portion 51 and the second flat portion 53 is designated by θ.

In an embodiment, a keyboard may be displayed in a part of the flexible display panel 10 included in the first flat portion 51, and a main screen may be displayed in a portion of the flexible display panel 10 included in the second flat portion 53. In this case, a user may touch the keyboard while viewing the main screen. That is, the user can use the rollable display device 100 like a laptop computer. Such a posture of the rollable display device 100 will be referred to as a laptop mode for convenience.

In the laptop mode, the second flat portion 53 may have a larger area than the first flat portion 51 such as to display the main screen widely. In this case, if no holding structure were provided, the second flat portion may fall back due to the weight of the second flat portion. In an embodiment, a support bar (i.e. a first support bar) 31 included in the second flat portion 53 among the plurality of support bars 30 includes a pair of rotatable first holding bars 60.

Figure 7:
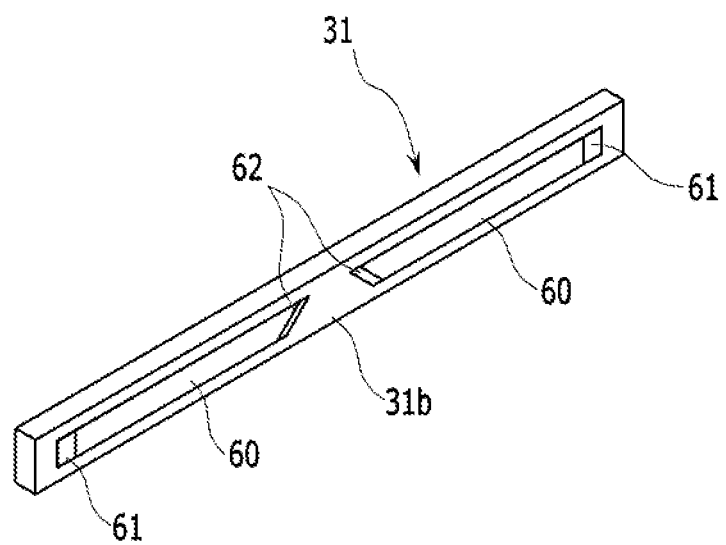
FIG. 7 and FIG. 8 are perspective views of a first support of the rollable display device of FIG. 1.
Figure 8:
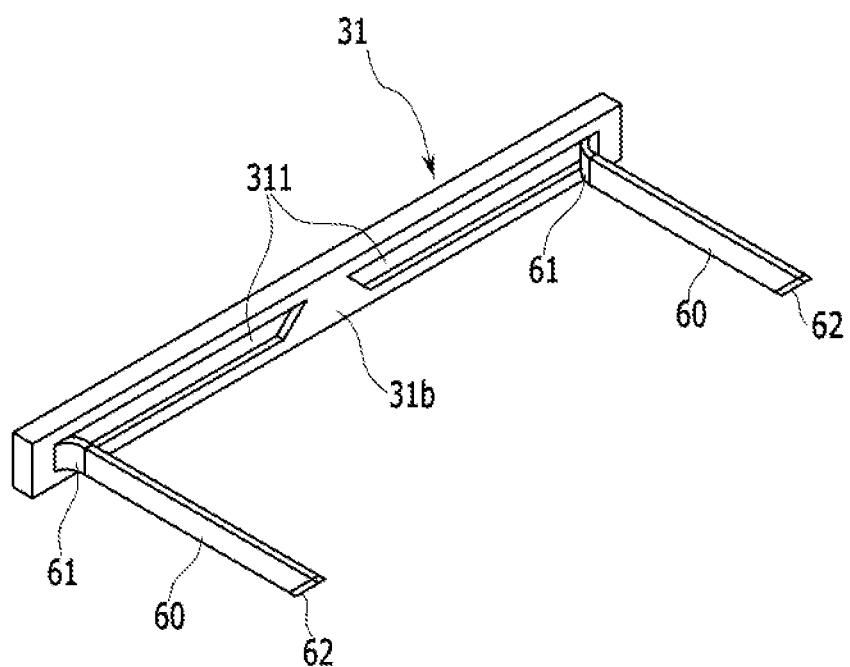

FIG. 7 and FIG. 8 are perspective views of a first support bar in the rollable display device 100.

Referring to FIG. 5 to FIG. 8, the first holding bars 60 are rotatable to the outside from a rear side 31b of the first support bar 31. For example, one end of each of the pair of first holding bars 60 may be coupled to the first support bar 31 through a respective rotatable or bendable first connection portion 61.

In an embodiment, the first holding bars 60 are symmetrically provided at a distance from each other in the first support bar 31, and the respective first connection portions 61 are disposed in parallel in a width direction of the first support bar 31 at opposite ends of the first support bar 31.

Each of the pair of first holding bars 60 may be in a folded position to be parallel with the first support bar 31 (refer to FIG. 7), or may be unfolded by being bent or being rotated to be approximately perpendicular, for example, to the first support bar 31 (refer to FIG. 8). The first connection portion 61 may be formed as a hinge shaft or may be made of a flexible material, for example.

In an embodiment, a distal end of each of the first holding bars 60 is inclined and may thus be parallel with the bottom plane BP, and surface-contacts the bottom plane BP. In an embodiment, a first anti-slip coating layer 62 may be provided at the distal end of each of the first holding bars 60. The first anti-slip coating layer 62 increases friction with respect to the bottom plane BP such that the first holding bar 60 can be prevented or substantially prevented from slipping.

The pair of first holding bars 60 may be provided in a buried type in the rear side 31b of the first support bar 31. For this, a pair of recess portions 311 may be provided in the rear side 31b of the first support bar 31 so as to receive the pair of first holding bars 60 therein. In an embodiment, the pair of first holding bars 60 do not protrude to the outside of the rear side 31b of the first support bar 31 when in a folded position, and, therefore, the rollable display device 100 can be rolled to be round or used in another posture without interference with another member.

The first support bar 31 is spaced apart from the outermost support bar 30 among the plurality of support bars 30 by a distance (e.g., a predetermined distance), and, in an embodiment, may be disposed approximately in a center or at the periphery of the center of the panel support 20. In an embodiment, in the laptop mode, the first support bar 31 may be closest to the curved portion 52 among the plurality of support bars 30 included in the second flat portion 53.

In the rollable display device 100 according to an exemplary embodiment, the second flat portion 53 can be prevented or substantially prevented from falling back in the laptop mode, thereby maintaining a stable posture.

Figure 9:
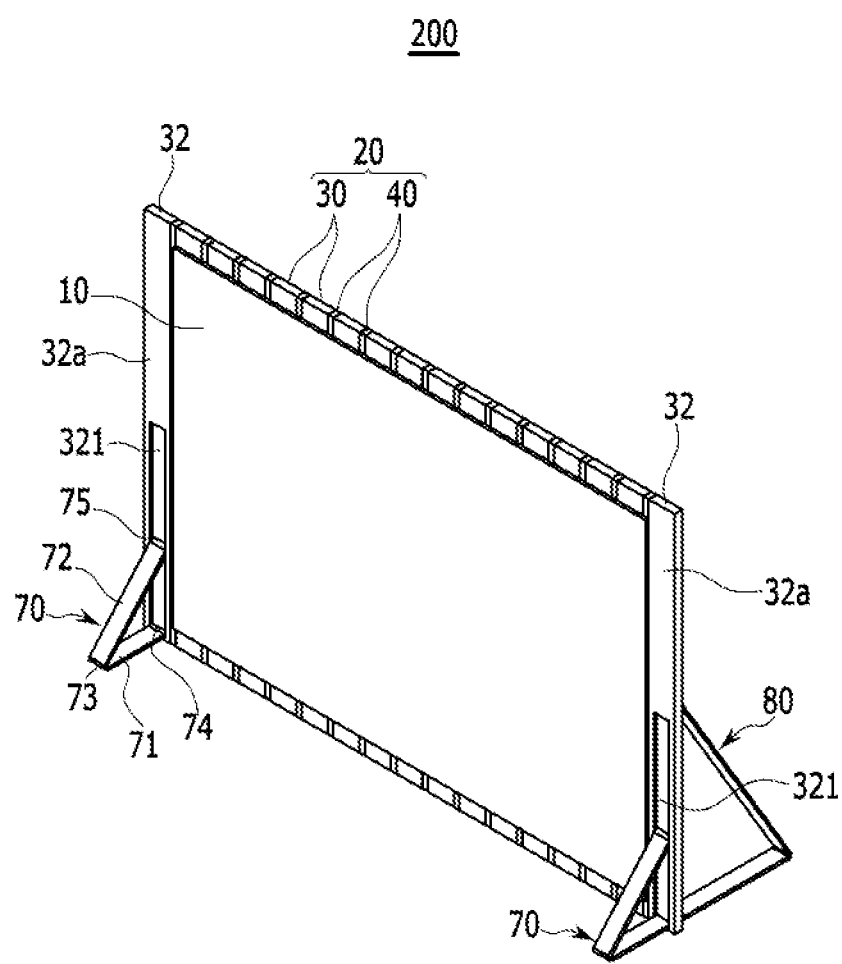
FIG. 9 is a front perspective view of a rollable display device according to another exemplary embodiment, shown in a standing state.
Figure 10:
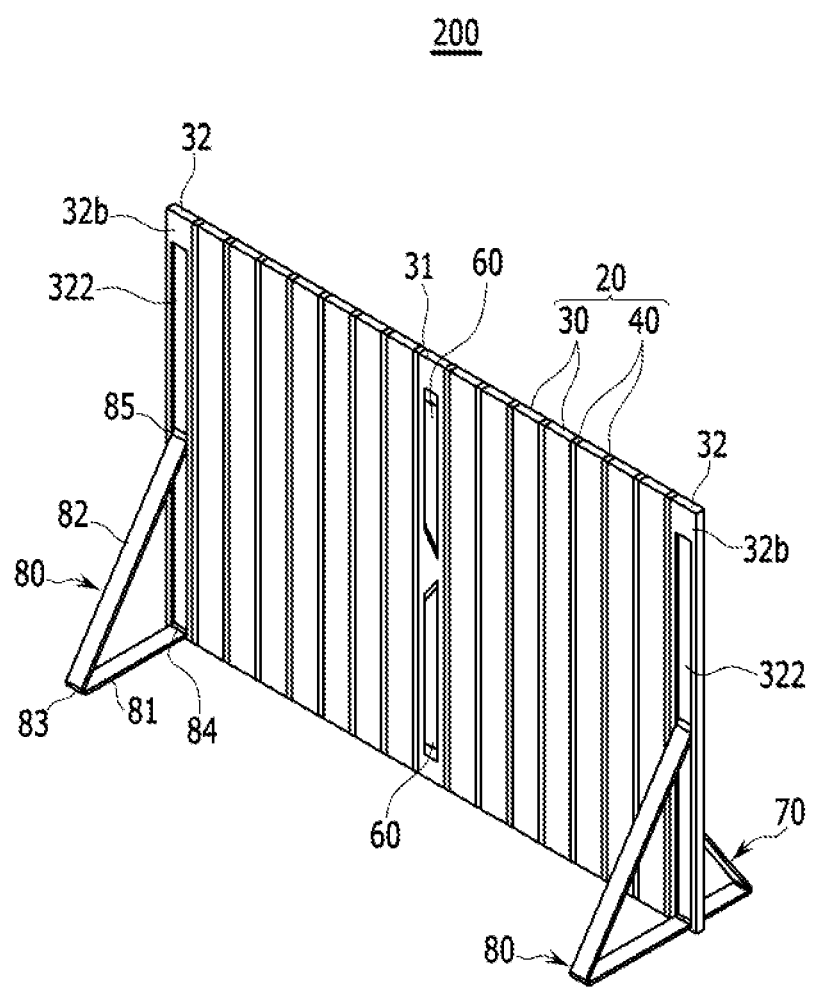
FIG. 10 is a rear perspective view of the rollable display device of FIG. 9, shown in a standing state.
Figure 11:
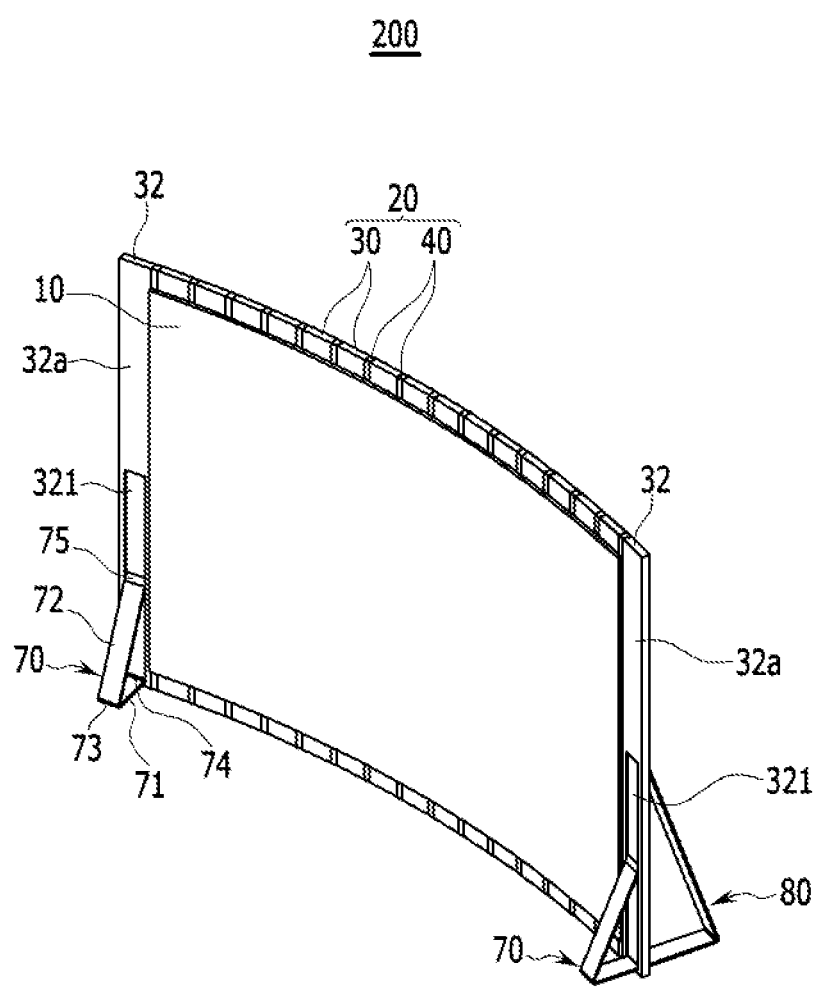
FIG. 11 is a front perspective view of the rollable display device of FIG. 9, shown in a standing state while being curved.
Figure 12:
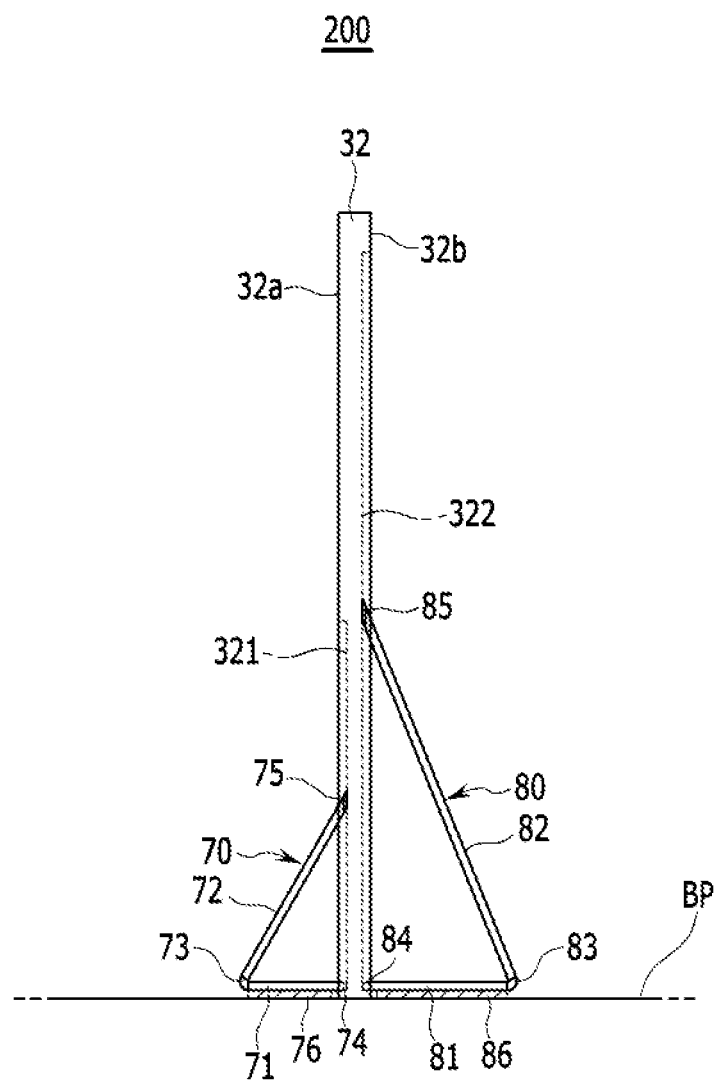
FIG. 12 is a side view of the rollable display device of FIG. 9.

FIG. 9 is a front perspective view of a rollable display device according to another exemplary embodiment, shown in a standing state; and FIG. 10 is a rear perspective view of the rollable display device of FIG. 9, shown in a standing state. FIG. 11 is a front perspective view of the rollable display device of FIG. 9, shown in a standing state while being curved; and FIG. 12 is a side view of the rollable display device of FIG. 9.

Referring to FIG. 9 to FIG. 12, a rollable display device 200 according to another exemplary embodiment includes a pair of second holding bars 70, each included in a respective one of a pair of support bars (i.e. second support bars) 32 that are disposed at the outermost sides among a plurality of support bars 30.

The rollable display device 200 according to an exemplary embodiment may stand at an angle to (e.g., perpendicular to) a bottom plane BP, and a posture of the display device 200 may be set to form a flat plane or a curved plane. In FIG. 9 and FIG. 10, the rollable display device 200 is set to be flat, and in FIG. 11, the rollable display device 200 is set to be concavely curved.

A user may use the rollable display device 200 as a monitor by standing the rollable display device 200, such as to be perpendicular to the bottom plane BP, and connecting an external keyboard (not shown) and/or the like thereto. Such a posture of the rollable display device 200 is referred to as a monitor mode for convenience.

In an embodiment, the pair of second support bars 32 may be dummy bars that do not overlap a flexible display panel 10. A pair of second holding bars 70 may be provided to be spreadable to the outside from a front side 32a of each of the pair of support bars 32.

In an embodiment, for example, each of the second holding bars 70 may include a first portion 71 and a second portion 72 that are coupled to each other by a rotatable or bendable second connection portion 73. In an embodiment, one end (i.e. a lower end) of the first portion 71 that opposes the second connection portion 73 may be coupled to the second support bar 32 by a rotatable or bendable third connection portion 74, and one end (i.e. an upper end) of the second portion 72 that opposes the second connection portion 73 may be coupled to the second support bar 32 by a first sliding member 75 that is movable along a length direction of the second support bar 32.

In an embodiment, the third connection portion 74 is disposed close to the one end (i.e. the lower end) of the second support bar 32, and the first sliding member 75 is disposed farther away from the one end (i.e. the lower end) of the second support bar 32 than the third connection portion 74. The second connection portion 73 and the third connection portion 74 may be formed of hinge shafts or flexible members, for example.

As the first sliding member 75 moves, a relative angle between the first portion 71 and the second portion 72 is changed such that the second holding bar 70 may be folded to be parallel with the front side 32a of the second support bar 32 or protrude (i.e. be unfolded) from the second support bar 32.

In an embodiment, when the first sliding member 75 is located farthest from the third connection portion 74, the first portion 71 and the second portion 72 become parallel with each other, and the second holding bars 70 are in a state of being folded to be parallel with the front side 32a of the second support bar 32. On the other hand, when the first sliding member 75 is moved and thus located closest to the third connection portion 74, the first portion 71 and the second portion 72 are protruded to the outside of the second support bar 32.

FIG. 9 and FIG. 12 respectively show that the second holding bar 70 is unfolded. While the second holding bar 70 is in the unfolded state, the first portion 71 contacts the bottom plane BP and the second portion 72 has an inclination angle (e.g., a predetermined inclination angle) with respect to the second support bar 70 and the bottom plane BP. In an embodiment, a second anti-slip coating layer 76 is formed at one side of the first portion 71 to contact the bottom plane BP such that the second holding bar 70 is prevented or substantially prevented from slipping.

The second holding bar 70 may be provided as a buried type in the front side 32a of the second support bar 32. Thus, a second recess portion 321 may be provided in the front side 32a of the second support bar 32, and the second holding bar 70 in the folded state may be received in the second recess portion 321. In an embodiment, a length of the second holding bar 70 in the folded state may be about half the length of the second support bar 32.

The rollable display device 200 according to an exemplary embodiment may further include a third holding bar 80 that is provided at a rear side 32b of each of the second support bars 32. The third holding bar 80 is provided to be spreadable to the outside from the rear side 32b of the second support bar 32. A basic configuration of the third holding bar 80 may be the same or substantially the same as that of the second holding bar 70, except that the third holding bar 80 may be longer than the second holding bar 70.

In an embodiment, for example, the third holding bar 80 may include a third portion 81 and a fourth portion 82 that are coupled by a rotatable or bendable fourth connection portion 83. In an embodiment, one end (i.e. a lower end) of the third portion 81, opposing the fourth connection portion 83, may be coupled to the second support bar 32 by a rotatable or bendable fifth connection portion 84, and one end of the fourth portion 82, opposing the fourth connection portion 83, may be coupled to the second support bar 32 by a second sliding member 85 that is movable along a length direction of the second support bar 32.

In an embodiment, the fifth connection portion 84 is disposed close to one end (i.e. a lower end) of the second support bar 32, and the second sliding member 85 is disposed away from the one end (i.e. the lower end) of the second support bar 32. The fourth connection portion 83 and the fifth connection portion 84 may be formed of hinge shafts or flexible members, for example.

As the second sliding member 85 moves, a relative angle formed by the third portion 81 and the fourth portion 82 is changed such that the third holding bars 80 may be folded to be parallel with the rear side 32b of the second support bar 32 or may protrude (i.e. be unfolded) from the second support bar 32.

In an embodiment, when the second sliding member 85 is located farthest from the fifth connection portion 84, the third portion 81 and the fourth portion 82 become parallel with each other, and the third holding bars 80 become folded to be parallel with the rear side 32b of the second support bar 32. Meanwhile, when the second sliding member 85 moves closest to the fifth connection portion 84, the third portion 81 and the fourth portion 82 are protruded to the outside and are thus unfolded.

FIG. 10 and FIG. 12 show the third holding bar 80 in the unfolded state. When the third holding bar 80 is in the unfolded state, the third portion 81 contacts the bottom plane BP and the fourth portion 82 forms an inclination angle (e.g., a predetermined inclination angle) with respect to the second support bar 32 and the bottom plane BP. In an embodiment, an anti-slip coating layer 86 is provided on one side of the third portion 81 to contact the bottom plane BP such that the third holding bar 80 is prevented or substantially prevented from slipping.

The third holding bar 80 may be provided as a buried type in the rear side 32b of the second support bar 32. For this, a third recess portion 322 may be provided in the rear side 32b of the second support bar 32, and the third holding bar 80 in the folded state may be received in the third recess portion 322. In an embodiment, a length of the third holding bar 80 in the folded state may be slightly shorter than a length of the second support bar 32.

When the rollable display device 200 according to an exemplary embodiment is used as a monitor by being stood relative to (e.g., perpendicular to) the bottom plane BP, the rollable display device 200 can maintain a stable posture without moving or falling back by the second holding bar 70 and the third holding bar 80. The rollable display device 200 according to an exemplary embodiment has the same or similar configuration as the rollable display device 100 described above, except that the second holding bar 70 and the third holding bar 80 are additionally provided.

While this disclosure has been described in connection with what are presently considered to be some practical exemplary embodiments, it is to be understood that the invention is not limited to the disclosed embodiments, but, on the contrary, is intended to cover various modifications and equivalent arrangements included within the spirit and scope of the appended claims.

What is claimed is:
1. A rollable display device comprising:
 a panel support including a plurality of support bars arranged relative to each other along a first direction and a plurality of flexible coupling portions between support bars of the plurality of support bars and coupling the plurality of support bars together such that the support bars are rotatable relative to each other about an axis extending in a direction crossing the first direction; and a flexible display panel fixed to respective front sides of support bars of the plurality of support bars, wherein the plurality of support bars comprises a first support bar that is disposed between each of opposite outermost support bars of the plurality of support bars along the first direction, and wherein the first support bar comprises a pair of first holding bars that are spreadable toward an outside from a rear side of the first support bar.

2. The rollable display device of claim 1, wherein respective first ends of each of the pair of first holding bars are coupled to lateral ends of the rear side of the first support bar by first connection portions that are rotatable or bendable.

3. The rollable display device of claim 2, wherein respective second ends of each of the pair of first holding bars opposite the first ends are inclined to be parallel with a bottom plane when the first holding bars are unfolded, and wherein each of the pair of first holding bars comprises a first anti-slip coating layer at the second end.

4. The rollable display device of claim 2, wherein the first support bar includes first recess portions in the rear side of the first support bar, and each of the pair of first holding bars is receivable in the first recess portions while being in a folded state.

5. The rollable display device of claim 1, wherein the panel support is configured to include a first flat portion to contact a bottom plane, a curved portion that is connected with the first flat portion, and a second flat portion that is connected with the curved portion to remain in a supported state above the bottom plane, and wherein each of the pair of first holding bars is contactable with the bottom plane while being unfolded.

6. The rollable display device of claim 1, wherein the plurality of support bars further comprises a pair of second support bars that are located at an outermost periphery of the panel support and do not overlap the flexible display panel, and wherein each of the pair of second support bars includes a second holding bar that is spreadable to the outside from a front side of the second support bar.

7. The rollable display device of claim 6, wherein the panel support is configured to include a flat portion or a curved portion and to stand to be perpendicular to a bottom plane.

8. A rollable display device comprising:

a panel support including a plurality of support bars arranged in a direction and a plurality of flexible coupling portions between support bars of the plurality of support bars and coupling the plurality of support bars together; and a flexible display panel fixed to respective front sides of support bars of the plurality of support bars, wherein the plurality of support bars comprises a first support bar that is spaced apart from an outermost support bar of the plurality of support bars, wherein the first support bar comprises a pair of first holding bars that are spreadable toward an outside from a rear side of the first support bar, wherein the panel support is configured to include a first flat portion to contact a bottom plane, a curved portion that is connected with the first flat portion, and a second flat portion that is connected with the curved portion to remain in a supported state above the bottom plane, wherein each of the pair of first holding bars is contactable with the bottom plane while being unfolded, and wherein the first support bar is a nearest support bar to the curved portion among support bars of the plurality of support bars that are included in the second flat portion.

9. A rollable display device comprising:

a panel support including a plurality of support bars arranged in a direction and a plurality of flexible coupling portions between support bars of the plurality of support bars and coupling the plurality of support bars together; and a flexible display panel fixed to respective front sides of support bars of the plurality of support bars, wherein the plurality of support bars comprises a first support bar that is spaced apart from an outermost support bar of the plurality of support bars, wherein the first support bar comprises a pair of first holding bars that are spreadable toward an outside from a rear side of the first support bar, wherein the plurality of support bars further comprises a pair of second support bars that are located at an outermost periphery of the panel support and do not overlap the flexible display panel, wherein each of the pair of second support bars includes a second holding bar that is spreadable to the outside from a front side of the second support bar, wherein each of the pair of second holding bars comprises a first portion and a second portion that are coupled to each other by a rotatable or bendable second connection portion, and wherein an end of the second portion opposite the second connection portion is slideable along a length direction of the second support bar such that an angle between the first portion and the second portion is changed.

10. The rollable display device of claim 9, wherein each of the pair of second holding bars is configured to be in an unfolded state such that the first portion is parallel with a bottom plane, and wherein each of the pair of second holding bars includes a second anti-slip coating layer on the first portion.

11. The rollable display device of claim 9, wherein each of the pair of second support bars includes second recess portions in the front side of the second support bar, and the second holding bars are receivable in the second recess portions while being folded.

12. A rollable display device comprising:

a panel support including a plurality of support bars arranged in a direction and a plurality of flexible coupling portions between support bars of the plurality of support bars and coupling the plurality of support bars together; and a flexible display panel fixed to respective front sides of support bars of the plurality of support bars, wherein the plurality of support bars comprises a first support bar that is spaced apart from an outermost support bar of the plurality of support bars, wherein the first support bar comprises a pair of first holding bars that are spreadable toward an outside from a rear side of the first support bar, wherein the plurality of support bars further comprises a pair of second support bars that are located at an outermost periphery of the panel support and do not overlap the flexible display panel, wherein each of the pair of second support bars includes a second holding bar that is spreadable to the outside from a front side of the second support bar, and wherein each of the pair of second support bars comprises a third holding bar that is spreadable to the outside from a rear side of the second support bar.

13. The rollable display device of claim 12, wherein the third holding bar comprises a third portion and a fourth portion that are coupled to each other by a rotatable or bendable fourth connection portion, and wherein an end of the fourth portion opposite the fourth connection portion is slideable along a length direction of the second support bar such that an angle between the third portion and the fourth portion is changed.

14. The rollable display device of claim 13, wherein the third portion is configured to be parallel with a bottom plane when the third holding bar is in an unfolded state, and wherein the third portion comprises a third anti-slip coating layer.

15. The rollable display device of claim 13, wherein each of the pair of second support bars includes third recess portions in the rear side of the second support bar, and the third holding bars are receivable in the third recess portions while being folded.

\* \* \* \* \*